United States Patent
Ishiguro et al.

(10) Patent No.: US 11,486,531 B2
(45) Date of Patent: Nov. 1, 2022

(54) THERMAL-INSULATED MULTI-WALLED PIPE FOR SUPERCONDUCTING POWER TRANSMISSION

(71) Applicant: JFE STEEL CORPORATION, Tokyo (JP)

(72) Inventors: Yasuhide Ishiguro, Tokyo (JP); Akio Sato, Tokyo (JP); Shigeto Sakashita, Tokyo (JP)

(73) Assignee: JFE STEEL CORPORATION, Tokyo (JP)

( * ) Notice: Subject to any disclaimer, the term of this patent is extended or adjusted under 35 U.S.C. 154(b) by 283 days.

(21) Appl. No.: 16/612,758

(22) PCT Filed: May 29, 2018

(86) PCT No.: PCT/JP2018/020583
§ 371 (c)(1),
(2) Date: Nov. 12, 2019

(87) PCT Pub. No.: WO2018/221522
PCT Pub. Date: Dec. 6, 2018

(65) Prior Publication Data
US 2020/0200316 A1 Jun. 25, 2020

(30) Foreign Application Priority Data
May 31, 2017 (JP) .............................. JP2017-107843

(51) Int. Cl.
*F16L 58/08* (2006.01)
*C23C 2/06* (2006.01)
(Continued)

(52) U.S. Cl.
CPC ................ *F16L 58/08* (2013.01); *C23C 2/06* (2013.01); *C23C 2/38* (2013.01); *F16L 59/065* (2013.01); *H01B 12/00* (2013.01); *H02G 3/0462* (2013.01)

(58) Field of Classification Search
CPC .......... F16L 58/08; F16L 59/065; C23C 2/06; C23C 2/38; H01B 12/00; H02G 3/0462
See application file for complete search history.

(56) References Cited

U.S. PATENT DOCUMENTS 4,546,798 A * 10/1985 Porta ..................... F16L 59/065
138/149
9,260,787 B2 2/2016 Lee et al.
(Continued)

FOREIGN PATENT DOCUMENTS

CN 104011252 A 8/2014
JP H101765 A 1/1998
(Continued)

OTHER PUBLICATIONS

Apr. 17, 2020, the Extended European Search Report issued by the European Patent Office in the corresponding European Patent Application No. 18810087.9.
(Continued)

*Primary Examiner* — Paul A Wartalowicz
(74) *Attorney, Agent, or Firm* — Kenja IP Law PC

(57) ABSTRACT

Provided is a thermal-insulated multi-walled pipe for superconducting power transmission that highly prevents intrusion of external heat due to radiation and has excellent thermal insulation property without using a superinsulation. A thermal-insulated multi-walled pipe for superconducting power transmission comprises: a superconducting cable; and a multi-walled pipe that houses the superconducting cable, wherein the multi-walled pipe is composed of a plurality of straight pipes, and at least one of the plurality of straight
(Continued)

pipes has, at a surface thereof, a zinc or zinc alloy-plated layer having an average spangle size of 2.0 mm or less.

4 Claims, 2 Drawing Sheets

(51) Int. Cl.
    *C23C 2/38*     (2006.01)
    *F16L 59/065*     (2006.01)
    *H01B 12/00*     (2006.01)
    *H02G 3/04*     (2006.01)

(56) References Cited

U.S. PATENT DOCUMENTS

| | | | |
|---|---|---|---|
| 2006/0211579 A1* | 9/2006 | Yamaguchi | H01B 12/14 505/230 |
| 2007/0137881 A1* | 6/2007 | Ashibe | H02G 15/34 174/125.1 |
| 2009/0142616 A1* | 6/2009 | Fujii | C23C 2/26 428/653 |

FOREIGN PATENT DOCUMENTS

| | | |
|---|---|---|
| JP | H1136057 A | 2/1999 |
| JP | 2000096262 A | 4/2000 |
| JP | 2001262305 A | 9/2001 |
| JP | 2002161349 A | 6/2002 |
| JP | 2002241917 A | 8/2002 |
| JP | 2007080649 A | 3/2007 |
| WO | 2014132765 A1 | 9/2014 |

OTHER PUBLICATIONS

May 12, 2021, Communication pursuant to Article 94(3) EPC issued by the European Patent Office in the corresponding European Patent Application No. 18810087.9.

Nov. 12, 2020, Communication pursuant to Article 94(3) EPC issued by the European Patent Office in the corresponding European Patent Application No. 18810087.9.

Aug. 21, 2018, International Search Report issued in the International Patent Application No. PCT/JP2018/020583.

Jul. 3, 2020, Office Action issued by the China National Intellectual Property Administration in the corresponding Chinese Patent Application No. 201880030311.9 with English language search report.

* cited by examiner

THERMAL-INSULATED MULTI-WALLED PIPE FOR SUPERCONDUCTING POWER TRANSMISSION

TECHNICAL FIELD

The present disclosure relates to a thermal-insulated multi-walled pipe for superconducting power transmission (a thermal-insulated multiple pipe for superconducting power transmission), and particularly relates to a thermal-insulated multi-walled pipe for superconducting power transmission that highly prevents intrusion of external heat due to radiation and has excellent thermal (heat) insulation property.

BACKGROUND

Superconductivity is a phenomenon in which, when a metal, an alloy, or the like is cooled, its electric resistance rapidly decreases to zero at a specific temperature. Applications of superconductivity are studied in various fields. In particular, superconducting power transmission, i.e. power transmission using a cable in a superconducting state, is proceeding toward practical utilization as a power transmission method with no power loss during power transmission.

In superconducting power transmission, to maintain a cable in a superconducting state, the cable needs to be constantly cooled. Hence, the use of a thermal-insulated multi-walled pipe is proposed. In the thermal-insulated multi-walled pipe, a cable of a superconducting material is placed in the innermost pipe (inner pipe) of the multi-walled pipe, and a coolant such as liquid nitrogen is flown into the inner pipe. Here, in the case where a large amount of heat enters the thermal-insulated multi-walled pipe from the external environment of the thermal-insulated multi-walled pipe, a large cooling unit is required in order to maintain the superconducting state, and the running cost increases. Various measures are therefore taken to prevent intrusion of external heat in the thermal-insulated multi-walled pipe.

First, a vacuum insulation layer is provided by decompressing the space between adjacent two pipes (inner pipe and outer pipe) of the plurality of pipes constituting the multi-walled pipe. By providing the vacuum insulation layer, intrusion of heat through air in the pipe can be prevented.

Further, a spacer made of a low thermal conductive material such as a resin is placed between the adjacent two pipes, as described in JP 2007-080649 A (PTL 1). By providing the spacer, the adjacent pipes are kept from being in direct contact with each other, and thus intrusion of external heat from the contact portion by thermal conduction can be prevented.

By use of the vacuum insulation layer and the spacer together, both heat intrusion through air and through direct contact between pipes can be prevented. However, it is known that heat intrusion into the thermal-insulated multi-walled pipe is caused not only by these factors but also by radiation of far-infrared rays or the like.

A known method of reducing heat intrusion due to radiation is a method using a thermal insulator called a superinsulation (SI). A superinsulation is also referred to as a multilayer insulation (MLI), having a structure in which aluminum vapor-deposited resin films are stacked, for example. By covering the surface of the inner pipe with such superinsulation, heat intrusion due to radiation from outside can be prevented.

The use of the superinsulation, however, has the following problems. First, when laying the thermal-insulated multi-walled pipe for superconducting power transmission in use, welding and cutting are usually performed to adjust the length of the thermal-insulated multi-walled pipe. Sparks emitted during such operation can ignite the superinsulation, causing fire or damage of the thermal-insulated multi-walled pipe for superconducting power transmission. Moreover, in the case of forming the vacuum insulation layer by decompressing the space where the superinsulation is located, the decompression time increases due to "gas components" derived from gas present in the superinsulation consisted of a multilayer film and from water and organic material adsorbed to the film.

In view of this, PTL 1 proposes providing a metal coating at the surfaces of the pipes constituting the thermal-insulated multi-walled pipe, instead of the superinsulation. The use of the metal coating can prevent intrusion of external heat due to radiation.

CITATION LIST

Patent Literature

PTL 1: JP 2007-080649 A

SUMMARY

Technical Problem

With the method using the metal coating proposed in PTL 1, intrusion of external heat due to radiation can be prevented to improve the thermal insulation property of the thermal-insulated multi-walled pipe for superconducting power transmission to some extent. However, further improvement in thermal insulation property is needed for practical utilization of superconducting power transmission. Thus, a method for preventing intrusion of external heat due to radiation at higher level needs to be developed.

It could therefore be helpful to provide a thermal-insulated multi-walled pipe for superconducting power transmission that highly prevents intrusion of external heat due to radiation, having excellent thermal insulation property without using a superinsulation.

Solution to Problem

As a result of studies, we discovered that the spangle size of a zinc or zinc alloy-plated layer influences emissivity (radiation factor).

Spangle is a pattern that appears on a hot-dip galvanized layer, and derives from solidified metal crystal grains. FIG. 1 illustrates a photograph of a hot-dip galvanized steel material surface as an example of the spangle pattern. In the spangle pattern, grains having the same crystal orientation are observed as one spangle, size of which depends on the production conditions. Even when hot-dip plated layers have the same chemical composition, their appearances differ greatly depending on the spangle size. So, the spangle size is generally selected in terms of design. We surprisingly discovered that, by using a zinc or zinc alloy-plated layer having an average spangle size of 2.0 mm or less, the emissivity can be reduced with improving the thermal insulation property of the thermal-insulated multi-walled pipe for superconducting power transmission.

The present disclosure is based on these discoveries. We thus provide the following.

1. A thermal-insulated multi-walled pipe for superconducting power transmission, comprising: a superconducting cable; and a multi-walled pipe that houses the superconducting cable, wherein the multi-walled pipe is composed of a plurality of straight pipes, and at least one of the plurality of straight pipes has, at a surface thereof, a zinc or zinc alloy-plated layer having an average spangle size of 2.0 mm or less.

2. The thermal-insulated multi-walled pipe for superconducting power transmission according to 1, wherein a resin coating layer is provided on an outer surface of an outermost straight pipe of the plurality of straight pipes.

Advantageous Effect

It is thus possible to prevent intrusion of external heat due to radiation and improve the thermal insulation property of the thermal-insulated multi-walled pipe for superconducting power transmission without using a superinsulation.

BRIEF DESCRIPTION OF THE DRAWINGS

In the accompanying drawings.

DETAILED DESCRIPTION

Figure 1:
FIG. 1 illustrates a photograph of an example of a spangle pattern.

A method according to one of the disclosed embodiments will be described in detail below. The following description merely concerns one of the preferred embodiments according to the present disclosure, and the present disclosure is not limited by the following description.

A thermal-insulated multi-walled pipe for superconducting power transmission according to the present disclosure includes a superconducting cable and a multi-walled pipe that houses the superconducting cable. The structure of each component will be described below.

[Superconducting Cable]

The superconducting cable may be any cable that can be used for superconducting power transmission. An example of a superconducting cable suitable for such use is a superconducting cable including a core (former) made of a metal such as copper, an insulation layer, and a conductor made of a superconducting material. The superconducting material may be any kind of superconducting material, but is preferably a high-temperature superconducting material that is in a superconducting state in a liquid nitrogen environment.

[Multi-Walled Pipe]

The superconducting cable is housed in the multi-walled pipe composed of a plurality of straight pipes. The multi-walled pipe may be a double pipe composed of two straight pipes, or of three or more straight pipes. The superconducting cable is typically housed inside the innermost pipe of the plurality of straight pipes constituting the multi-walled pipe. When actually using the thermal-insulated multi-walled pipe for superconducting power transmission, a coolant for the superconducting cable is flown into the pipe (typically, the innermost pipe) housing the superconducting cable. As the coolant, for example, liquid nitrogen may be used. The multi-walled pipe may include a further additional pipe (or pipes) optionally. For example, a double pipe composed of an outer pipe and an inner pipe may further include, in the outer pipe, an additional pipe independent other than the inner pipe.

In the present disclosure, it is important that the multi-walled pipe is composed of straight pipes only, without using corrugate pipes or flexible pipes. A straight pipe has a smaller surface area per unit length than a corrugate pipe or a flexible pipe, and therefore can prevent external heat intrusion. The term "straight pipe" herein denotes a pipe which is not formed in a wave shape such as a corrugate pipe or a flexible pipe but a pipe having a substantially constant cross-sectional area, including a straight pipe subjected to bending. The shape of the straight pipe in a section perpendicular to the longitudinal direction is preferably circular.

The material of each straight pipe is not limited, but a metal is preferred. As the metal, one or more selected from the group consisting of aluminum, an aluminum alloy, iron, steel, a Ni-based alloy, and a Co-based alloy, for example, is preferably used. In particular, a straight steel pipe is preferred for the straight pipe, in terms of strength, corrosion resistance, cost, etc. One or both of carbon steel and stainless steel are preferred for the material of the straight steel pipe. The plurality of straight pipes constituting the multi-walled pipe may be made of the same material or different materials.

Of the plurality of straight pipes constituting the multi-walled pipe, the material of the straight pipe (hereafter referred to as "cable-housing pipe") that directly houses the superconducting cable is preferably a steel material whose volume fraction of austenite phase is 80% or more. Two main reasons for this are as follows. One reason is that a steel material having a microstructure mainly composed of austenite has excellent elongation. For example, when winding the multi-walled pipe around a reel barge to lay the pipe, a pipe on the inner side of the plurality of straight pipes constituting the multi-walled pipe is deformed more, due to the differences in bending radius. A steel material whose volume fraction of austenite phase is 80% or more is suitable as the material for the cable-housing pipe located on the inner side for its excellent elongation. The second reason is that a steel material having a microstructure mainly composed of austenite has excellent low-temperature toughness. Since coolant such as liquid nitrogen flows in the cable-housing pipe, a steel material whose volume fraction of austenite phase is 80% or more is suitable in terms of strength and toughness at low temperature.

The steel material whose volume fraction of austenite phase is 80% or more may be any steel material satisfying the condition. The volume fraction of austenite is preferably 90% or more. No upper limit is placed on the volume fraction of austenite, and the upper limit may be 100%. Examples of the steel material whose volume fraction of austenite phase is 80% or more include austenitic stainless steel and an austenitic steel material containing Mn (i.e. high manganese steel). The Mn content in the high manganese steel is preferably 11 mass % or more. As the austenitic stainless steel, SUS316L is preferable.

In the case of using a straight steel pipe as the straight pipe, a steel pipe may be produced by any method as the straight steel pipe. Examples of the steel pipe suitable for use include an electric-resistance-welded pipe, a seamless pipe, and a UOE pipe. The straight steel pipe may be optionally subjected to a surface treatment. As the surface treatment, for example, one or more selected from the group consisting of pickling, electropolishing, and chemical polishing is preferably performed.

Total Thickness

The thickness of each of the plurality of straight pipes constituting the multi-walled pipe may independently be any value. The total thickness of the plurality of straight pipes is preferably 10 mm or more, and more preferably 15 mm or more. As a result of the total thickness being in such a range, when laying the thermal-insulated multi-walled pipe for superconducting power transmission on the sea bottom, the thermal-insulated multi-walled pipe for superconducting power transmission sinks under its own weight. Thus, the thermal-insulated multi-walled pipe for superconducting power transmission can be laid easily without using a weight and the like, and has such strength that can withstand water pressure and the like.

The thickness of each of the plurality of straight pipes constituting the multi-walled pipe is not limited, but is preferably 3 mm or more. The thickness of the outermost pipe of the plurality of straight pipes constituting the multi-walled pipe is more preferably 8 mm or more.

[Zinc or Zinc Alloy-Plated Layer]

A zinc or zinc alloy-plated layer having an average spangle size of 2.0 mm or less (hereafter also simply referred to as "zinc or zinc alloy-plated layer") is provided on a surface of at least one of the plurality of straight pipes constituting the multi-walled pipe. By limiting the average spangle size to 2.0 mm or less, the emissivity of the zinc or zinc alloy-plated layer, in particular the emissivity in a far infrared region, can be reduced. Consequently, intrusion of external heat due to radiation of far infrared rays or the like can be prevented, and the thermal insulation property of the thermal-insulated multi-walled pipe for superconducting power transmission can be improved. The average spangle size is preferably 1.5 mm or less, more preferably 1.0 mm or less, and further preferably 0.8 mm or less. In a local thermal equilibrium state, emissivity is equal to absorptance. The average spangle size can be measured by the method described in the EXAMPLES section.

The mechanism by which the emissivity decreases as a result of the average spangle size being 2.0 mm or less is not clear, but is presumed as follows: In a case where spangle is coarse, light reflects irregularly, as a result of which absorption of far infrared rays or the like increases. By refining the spangle, heat intrusion due to radiation of far infrared rays or the like can be prevented.

In terms of emissivity reduction, the spangle size is preferably as small as possible. Hence, no lower limit is placed on the average spangle size. For example, the spangle may be as fine as the spangle pattern is not visible, i.e. zero spangle. A zinc or zinc alloy-plated layer having no spangle pattern may be used as the zinc or zinc alloy-plated layer in the present disclosure, as described later.

The zinc or zinc alloy-plated layer may be any zinc or zinc alloy-plated layer having an average spangle size not exceeding 2.0 mm. Examples of the zinc or zinc alloy-plated layer include a hot-dip galvanized layer formed by hot dip plating, a galvannealed layer obtained by alloying a hot-dip galvanized layer, and an electrogalvanized layer formed by electroplating. The galvannealed layer can be obtained by performing a heat treatment (alloying treatment) on a plated layer after hot dip plating. The galvannealed layer and the electrogalvanized layer typically do not have observable spangle, and thus are included in the zinc or zinc alloy-plated layer having an average spangle size of 2.0 mm or less in the present disclosure.

As the zinc or zinc alloy-plated layer, any of a zinc-plated layer and a zinc alloy-plated layer may be used. The zinc alloy forming the zinc alloy-plated layer may be, for example, an Al—Zn alloy.

The zinc or zinc alloy-plated layer is provided on at least one of the plurality of straight pipes constituting the multi-walled pipe. The zinc or zinc alloy-plated layer may be provided on all of the plurality of straight pipes constituting the multi-walled pipe. Each straight pipe may have the plated layer at one or both of its outer surface and inner surface. Particularly in the case where the zinc or zinc alloy-plated layer is provided on the outer surface of the outermost pipe that contacts with the external environment, the corrosion resistance of the thermal-insulated multi-walled pipe for superconducting power transmission can be effectively improved by the sacrificial protection effect of zinc.

The method of limiting the average spangle size to the foregoing range is not limited, and may be any method. In the case where the zinc or zinc alloy-plated layer is a hot-dip galvanized layer, spangle may be refined by a conventional method in hot dip plating. For example, a method of increasing the cooling rate after hot dip plating, that is, a method of performing rapid cooling after plating to refine spangle, may be used. Since a galvannealed layer and an electrogalvanized layer do not have observable spangle as mentioned above, the emissivity is reduced to as low as that of a hot-dip galvanized layer having an average spangle size of 2.0 mm or less.

When the ratio (S2/S1) (hereafter also referred to as "plating area ratio") of the area S2 of the zinc or zinc alloy-plated layer having an average spangle size of 2.0 mm or less to the surface area S1 of the surface of the straight pipe on which the zinc or zinc alloy-plated layer having an average spangle size of 2.0 mm or less is provided is higher, the emissivity reduction effect and the sacrificial protection effect of zinc are higher. Therefore, the plating area ratio is preferably 50% or more, more preferably 70% or more, further preferably 90% or more, and most preferably 95% or more. The plating area ratio is preferably as high as possible, and the upper limit may be 100%. In the case where the zinc or zinc alloy-plated layer is provided on both surfaces of one straight pipe, i.e. both of the outer and inner surfaces of one straight pipe, it is preferable that the plating area ratio of at least one of the surfaces satisfies the foregoing condition, and more preferable that the plating area ratio of both surfaces satisfies the foregoing condition.

In the case where the plating area ratio is less than 100%, other plated layer described below may be provided or no plated layer may be provided in the remaining part, i.e. the part where the zinc or zinc alloy-plated layer having an average spangle size of 2.0 mm or less is not provided. A part where plated layer is not formed due to plating defects or the like may be subjected to repair painting. In terms of corrosion resistance improvement, a paint containing a metal powder having a sacrificial protection effect, such as a zinc rich paint, is preferably used in the repair painting.

[Other Plated Layer]

As long as the zinc or zinc alloy-plated layer having an average spangle size of 2.0 mm or less is provided on a surface of at least one of the plurality of straight pipes constituting the multi-walled pipe, no plated layer may be provided in the other parts. Alternatively, other plated layer may be provided in a part (or parts) where the zinc or zinc alloy-plated layer having an average spangle size of 2.0 mm or less is not provided.

The material of the other plated layer is not limited, and may be any metal. Examples of the metal include zinc, a zinc alloy, aluminum, and an aluminum alloy. Examples of the method of forming the other plated layer include hot dip plating and electroplating. For example, the other plated layer may be a zinc or zinc alloy-plated layer having an average spangle size of more than 2.0 mm.

For example, a zinc or zinc alloy-plated layer is formed at the outer and inner surfaces of the outermost pipe of the plurality of straight pipes constituting the multi-walled pipe, and the average spangle size in the plated layer on one or both of the outer and inner surfaces of the outermost pipe is set to 2.0 mm or less. Thus, the emissivity can be reduced, and the corrosion resistance can be improved by the sacrificial protection effect of zinc. Meanwhile, other plated layer such as a hot-dip aluminum-plated layer may be provided on the outer and inner surfaces of a straight pipe other than the outermost pipe, i.e. a straight pipe not in contact with the external corrosive environment. The emissivity reduction effect and the sacrificial protection effect of the aluminum-plated layer are at least as high as those of the zinc or zinc alloy-plated layer. However, it is difficult to coat a steel pipe with aluminum. By using the zinc or zinc alloy-plated layer having an average spangle size of 2.0 mm or less instead of at least part of the aluminum-plated layers in this way, production is eased while improving the emissivity reduction effect.

[Resin Coating Layer]

Furthermore, a resin coating layer may be provided on the outer surface of the outermost straight pipe of the plurality of straight pipes. The corrosion resistance of the thermal-insulated multi-walled pipe for superconducting power transmission can be further improved by coating with a resin. Particularly in the case where the thermal-insulated multi-walled pipe for superconducting power transmission is buried in the ground, it is preferable to provide the resin coating layer.

The resin forming the resin coating layer is not limited, and may be any resin. As the resin, for example, one or more selected from the group consisting of polyethylene resin, urethane resin, epoxy resin, and mixtures thereof is preferable, and polyethylene resin is more preferable.

As the polyethylene resin, one or both of a homopolymer of ethylene and a copolymer of ethylene and α-olefin are preferably used. Examples of the α-olefin include propylene, 1-butene, 1-pentene, 1-hexene, 4-methyl-1-pentene, 1-octene, and 1-decene. As the polyethylene resin, a high-density polyethylene resin with a density of 915 kg/m$^3$ or more is preferably used.

The method of forming the resin coating layer is not limited, and may be any method. For example, molten resin may be extruded using a round die or a T die to coat the outside of the steel pipe. Alternatively, powder coating may be performed to coat the outside of the steel pipe with the resin. The thickness of the resin coating layer is preferably 0.1 mm or more, and more preferably 0.5 mm or more. The thickness of the resin coating layer is preferably 3.0 mm or less, and more preferably 2.0 mm or less.

If the resin coating layer contains a metal powder, the metal powder reflects infrared rays or the like irregularly, as a result of which the amount of energy entering the thermal-insulated pipe increases. Accordingly, the resin coating layer preferably does not contain a metal powder. The resin coating layer may be a coating layer made only of resin.

[Spacer]

A spacer may be placed between adjacent two straight pipes of the plurality of straight pipes constituting the multi-walled pipe. By providing the spacer, the adjacent two pipes are kept from being in direct contact with each other, so that direct heat conduction can be prevented. A plurality of spacers are preferably arranged at a spacing in the longitudinal direction of the thermal-insulated multi-walled pipe for superconducting power transmission.

The shape of the spacer is not limited. For example, a sheet-shaped spacer having a through-hole in the thickness direction at the center is preferable. By passing the inner straight pipe of the adjacent two straight pipes through the through-hole, the spacer can be stably placed between the adjacent two straight pipes.

In terms of reducing the contact area between the steel pipe and the spacer, the cross-sectional shape of the spacer in a plane perpendicular to the longitudinal direction of the thermal-insulated multi-walled pipe for superconducting power transmission is preferably a polygon. The polygon may be any polygon with three or more vertices. Examples include a triangle, a quadrangle, a pentagon, and a hexagon. The polygon is not limited to a regular polygon. For example, as the quadrangle, not only a square but also a rectangle whose long side and short side differ in length may be used. The term "polygon" herein includes not only a geometrically perfect polygon but also a substantial polygon obtained by applying a minor change to a perfect polygon. For example, the shape of the spacer is regarded as the polygon even in the case where the corners of the spacer are round or flat due to wear, deformation, or the like.

The material of the spacer may be any material. In terms of low thermal conductivity and low friction coefficient, the material is preferably a resin, and more preferably a fluororesin. Examples of the fluororesin include polytetrafluoroethylene (PTFE), polyvinylidene fluoride (PVDF), polyvinyl fluoride (PVF), and polychlorotrifluoroethylene (PCTFE). To improve the strength of the spacer, a fiber reinforced plastic (FRP) obtained by adding a fibrous filler to the resin may be used. The FRP is, for example, a glass fiber reinforced plastic (GFRP). Other optional fillers may be added. However, if a filler is added, there is a possibility that the thermal conductivity of the spacer increases, and the thermal insulation property decreases. Hence, the resin used for the spacer preferably does not contain a filler, in terms of thermal insulation property.

The spacers may be arranged at any spacing in the longitudinal direction of the thermal-insulated multi-walled pipe for superconducting power transmission. The spacing may be regular spacing or irregular spacing. The spacing is not limited, and may be any value. If the spacing is excessively large, the contact between the pipes constituting the multi-walled pipe may be unable to be prevented. The spacing is therefore preferably 10 m or less. If the spacing is excessively small, the spacer installation cost increases. The spacing is therefore preferably 1 m or more. Changes of the positions of the spacers in association with operation such as pipe laying are acceptable.

[Vacuum Insulation Layer]

The space between adjacent two straight pipes of the plurality of straight pipes constituting the multi-walled pipe may be decompressed to form a vacuum insulation layer. By providing the vacuum insulation layer, intrusion of external heat can be further prevented. The vacuum insulation layer may be formed when laying the thermal-insulated multi-walled pipe for superconducting power transmission. That is, the vacuum insulation layer need not be formed in the thermal-insulated multi-walled pipe for superconducting power transmission prior to laying. The vacuum insulation layer is preferably formed in the space where the spacer is located.

The vacuum insulation layer is formed by exhausting (vacuuming) the space between the adjacent two straight pipes. The exhaustion may be performed once after laying the thermal-insulated multi-walled pipe for superconducting power transmission, or performed twice or more. For example, preliminary exhaustion (provisional vacuuming) is performed before laying, and exhaustion to the final vacuum (main vacuuming) is performed after laying.

EXAMPLES

Example 1

To determine the effects according to the present disclosure, zinc or zinc alloy-plated layers different in average spangle size were formed, and their emissivity was evaluated.

First, a plurality of test pieces of 50 mm×100 mm made of the same steel material were produced, and subjected to hot-dip galvanizing under different conditions to form a hot-dip galvanized layer. After the plating, part of the test pieces was further subjected to an alloying treatment to form a galvannealed layer. While the sheet-shaped test pieces were used here, the shape of the base material does not directly influence the emissivity.

For each of the obtained plated layers, average spangle size measurement and emissivity evaluation were performed by the following methods.

(Average Spangle Size)

The average spangle size was evaluated by linear analysis. A specific procedure is as follows. First, a given straight line was drawn on the surface of the plated layer, the number of spangle grains crossing the straight line was counted, and the result of dividing the length of the straight line by the number of spangle grains was taken to be the average spangle size. In the case where it was difficult to identify spangle grains, crystal orientations were analyzed by EBSP (Electron BackScattering Pattern) measurement or the like, and, in the case where there was a difference of 15° or more in crystal orientation between two regions, the regions were determined as separate spangle grains. Thus, a spangle grain in which a twin crystal was present and slightly different color tones were included was regarded as one spangle.

(Emissivity)

Figure 2:
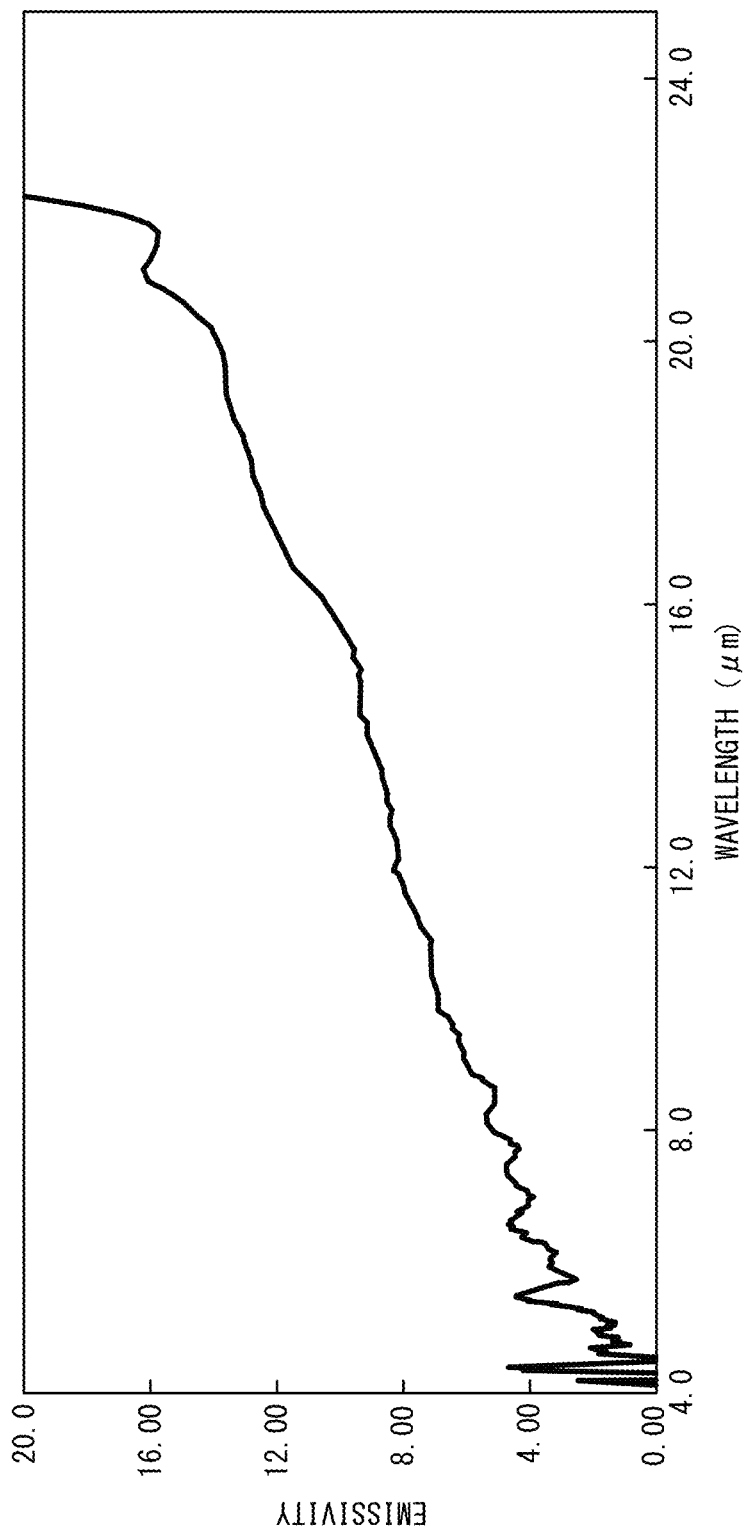
FIG. 2 is a diagram illustrating an example of emissivity measurement results by a far infrared spectroradiometer.

The emissivity of the surface of the obtained plated layer was measured using a far infrared spectroradiometer (JEOL Ltd., JIR-E500). The emissivity measurement was performed in a wavelength range of 4 μm to 25 μm, and the emissivity at wavelengths of 8 μm, 12 μm, 16 μm, and 20 μm except both ends containing noise was used for the evaluation. For reference, FIG. 2 illustrates an example of emissivity measurement results by a far infrared spectroradiometer.

The emissivity was evaluated based on the following evaluation criteria, using the following first conditions (1) to (4) which are preferable conditions and second conditions (5) to (8) which are more preferable conditions.

[First Conditions]
(1) Emissivity at wavelength of 8 μm: less than 8%.
(2) Emissivity at wavelength of 12 μm: less than 12%.
(3) Emissivity at wavelength of 16 μm: less than 15%.
(4) Emissivity at wavelength of 20 μm: less than 18%.

[Second Conditions]
(5) Emissivity at wavelength of 8 μm: less than 6%.
(6) Emissivity at wavelength of 12 μm: less than 9%.
(7) Emissivity at wavelength of 16 μm: less than 12%.
(8) Emissivity at wavelength of 20 μm: less than 14%.

[Evaluation Criteria]
Not satisfying any of the first conditions (1) to (4): poor.
Satisfying part of the first conditions (1) to (4): unsatisfactory.
Satisfying all of the first conditions (1) to (4): satisfactory.
Satisfying all of the first conditions (1) to (4) and part of the second conditions (5) to (8): good.
Satisfying all of the second conditions (5) to (8): excellent.

The evaluation results are shown in Table 1. In No. 1 and 2, the spangle size was 1 cm or more by visual inspection, and accordingly determined as "coarse". In No. 8 and 9, spangle was too fine to be visible, and was clearly 2.0 μm or less, and accordingly determined as "fine". For comparison, the results of evaluating the reflectivity of a conventionally used superinsulation by the same method are also shown in the table (No. 10).

TABLE 1

| No. | Coated layer | Average spangle size (mm) | Evaluation result of emissivity | Category |
| --- | --- | --- | --- | --- |
| 1 | Hot-dip galvanized | Coarse (>3 cm) | Poor | Comparative Example |
| 2 | Hot-dip galvanized | Coarse (about 1 cm) | Poor | Comparative Example |
| 3 | Hot-dip galvanized | 5.0 | Unsatisfactory | Comparative Example |
| 4 | Hot-dip galvanized | 2.0 | Satisfactory | Example |
| 5 | Hot-dip galvanized | 1.8 | Good | Example |
| 6 | Hot-dip galvanized | 1.0 | Good | Example |
| 7 | Hot-dip galvanized | 0.8 | Excellent | Example |
| 8 | Hot-dip galvanized | Fine | Excellent | Example |
| 9 | Galvannealed | Fine | Excellent | Example |
| 10 | Superinsulation | | Satisfactory | Comparative Example |

As can be understood from the results in Table 1, each hot-dip galvanized layer having an average spangle size of 2.0 mm or less had emissivity lower than or equal to that of the conventional superinsulation. When the spangle size was smaller, the emissivity was lower. A galvannealed layer had a smooth appearance with very fine crystal grains, and its emissivity was very low.

Example 2

To determine the influence of providing a resin coating layer, the following experiment was conducted.

First, a plurality of test pieces of 50 mm×100 mm made of the same steel material were produced, and subjected to hot-dip galvanizing under different conditions to form a hot-dip galvanized layer. Next, the average spangle size of the hot-dip galvanized layer was measured by the same method as in Example 1. The measurement results are shown in Table 2.

A resin coating layer made of polyethylene resin was then formed at the surface of the hot-dip galvanized layer. The average thickness of the resin coating layer was 2.8 mm. For comparison, a sample (No. 21) was produced by directly providing a resin coating layer made of polyethylene resin at the surface of a base steel sheet as the foregoing test piece without forming a plated layer (hereafter referred to as "reference sample").

(Emissivity)

For each of the obtained samples, the emissivity was measured by the same method as in Example 1. The measurement was performed with n=3. Using the obtained average value of emissivity at wavelengths of 8 μm, 12 μm, 16 μm, and 20 μm, the emissivity was evaluated based on the following evaluation criteria. In the evaluation, the measurement value of emissivity of the reference sample (No. 21) with no plated layer was used as a reference value. The evaluation results are shown in Table 2.

[Evaluation Criteria]

Equal: difference between emissivity (%) of sample and emissivity (%) of reference sample being within 5 points (5 percentage points) at all wavelengths of 8 μm, 12 μm, 16 μm, and 20 μm.

Good: emissivity (%) of sample at at least one of wavelengths of 8 μm, 12 μm, 16 μm, and 20 μm being lower by more than 5 points (5 percentage points) than emissivity of reference sample at same wavelength.

TABLE 2

| | Plated layer | | Resin | Evaluation | |
|---|---|---|---|---|---|
| No. | Type | Average spangle size (mm) | coating layer | result of emissivity | Category |
| 21 | — | | Polyethylene | (Reference) | (Reference) |
| 22 | Hot-dip galvanized | Coarse (>3 cm) | Polyethylene | Equal | Comparative Example |
| 23 | Hot-dip galvanized | 2.0 | Polyethylene | Good | Example |
| 24 | Hot-dip galvanized | 1.0 | Polyethylene | Good | Example |

By providing the resin coating layer, the steel pipe surface is blocked from the external corrosive environment, so that the corrosion resistance can be improved very effectively. However, in the case where the resin coating layer is provided, the emissivity increases due to complex reflection of far infrared energy. As can be understood from the results in Table 2, by providing a zinc or zinc alloy-plated layer having an average spangle size of 2.0 mm or less as the base of the resin coating layer, the influence of the resin coating layer was canceled, and the emissivity was reduced. In the case of providing a zinc or zinc alloy-plated layer having an average spangle size of more than 2.0 mm, on the other hand, the emissivity was substantially equal to that of the reference sample with no plated layer.

Thus, combining a zinc or zinc alloy-plated layer having an average spangle size of 2.0 mm or less and a resin coating layer can achieve excellent corrosion resistance while reducing emissivity.

The invention claimed is:

1. A thermal-insulated multi-walled pipe for superconducting power transmission, comprising:
   a superconducting cable; and
   a multi-walled pipe that houses the superconducting cable,
   wherein the multi-walled pipe is composed of a plurality of straight pipes, and
   at least one of the plurality of straight pipes has, at a surface thereof, a zinc-plated layer having an average spangle size of 2.0 mm or less.

2. The thermal-insulated multi-walled pipe for superconducting power transmission according to claim 1, wherein a resin coating layer is provided on an outer surface of an outermost straight pipe of the plurality of straight pipes.

3. The thermal-insulated multi-walled pipe for superconducting power transmission according to claim 2, wherein the average spangle size of 0.8 mm or less.

4. The thermal-insulated multi-walled pipe for superconducting power transmission according to claim 1, wherein the average spangle size of 0.8 mm or less.

* * * * *